(12) United States Patent
Chen et al.

(10) Patent No.: US 9,741,541 B1
(45) Date of Patent: Aug. 22, 2017

(54) APPARATUS OF HIGH FREQUENCY PLASMA

(71) Applicant: Institute of Nuclear Energy Research, Atomic Energy Council, Executive Yuan, R.O.C., Taoyuan (TW)

(72) Inventors: Hsin-Liang Chen, Pingtung County (TW); Cheng-Chang Hsieh, Chiayi (TW); Deng-Lain Lin, Taoyuan (TW); Ching-Pei Tseng, Taoyuan (TW); Ming-Chung Yang, Taoyuan (TW)

(73) Assignee: INSTITUTE OF NUCLEAR ENERGY RESEARCH, ATOMIC ENERGY COUNCIL, EXECUTIVE YUAN, R.O.C., Taoyuan (TW)

( * ) Notice: Subject to any disclaimer, the term of this patent is extended or adjusted under 35 U.S.C. 154(b) by 0 days.

(21) Appl. No.: 15/196,619

(22) Filed: Jun. 29, 2016

(30) Foreign Application Priority Data

May 13, 2016 (TW) .............................. 105114913 A

(51) Int. Cl.
  *H01J 7/24* (2006.01)
  *H05B 31/26* (2006.01)
  *H01J 37/32* (2006.01)

(52) U.S. Cl.
  CPC .. *H01J 37/32128* (2013.01); *H01J 37/32532* (2013.01); *H01J 2237/3321* (2013.01); *H01J 2237/3323* (2013.01); *H01J 2237/3325* (2013.01)

(58) Field of Classification Search
  None
  See application file for complete search history.

(56) References Cited

U.S. PATENT DOCUMENTS

| | | | | |
|---|---|---|---|---|
| 6,456,010 B2 * | 9/2002 | Yamakoshi | ....... | H01J 37/32082 313/231.31 |
| 2012/0001549 A1 * | 1/2012 | Ellingboe | ......... | H01J 37/32009 315/111.21 |
| 2014/0375207 A1 * | 12/2014 | Chen | ................. | H01J 37/32128 315/111.21 |

OTHER PUBLICATIONS

Hsin-Liang Chen et al., Improving discharge uniformity of industrial-scale very high frequency plasma sources by launching a traveling wave, Current Applied Physics, 2016, 700-706, vol. 16, Issue 7.

* cited by examiner

*Primary Examiner* — Anh Tran
(74) *Attorney, Agent, or Firm* — Locke Lord LLP; Tim Tingkang Xia, Esq.

(57) ABSTRACT

A high frequency plasma apparatus includes a reaction chamber, a first electrode, a second electrode, and a plurality of feed points located at one of the two electrodes at least. The feed points are used to simultaneously generate a first standing wave and a second standing wave, with different temporal and spatial patterns. By adjusting amplitudes of the two standing waves and the temporal and spatial phase differences between the two standing waves appropriately, plasma uniformity of the high frequency plasma apparatus can be effectively improved.

14 Claims, 16 Drawing Sheets

APPARATUS OF HIGH FREQUENCY PLASMA

CROSS REFERENCE TO RELATED APPLICATION

This application claims the benefit of Taiwan Patent Application Serial No. 105114913, filed May 13, 2016, the subject matter of which is incorporated herein by reference.

BACKGROUND OF INVENTION

1. Field of the Invention

The invention relates to a high frequency plasma apparatus, and more particularly to the high frequency plasma apparatus that utilizes the superposition of two standing waves, simultaneously generated but with different temporal and spatial patterns, so as to effectively improve the uniformity of plasma discharge.

2. Description of the Prior Art

Plasma-enhanced chemical vapor deposition (PECVD) has been widely applied to various hi-tech industries, such as semiconductor, flat display panel and solar cell industries. Currently, capacitive coupled plasma (CCP), typically operated at 13.56 MHz, remains the mainstream plasma source for PECVD. In order to further reduce the production costs by improving the throughputs, a higher deposition rate and a larger electrode are both necessary. However, due to the capacitive nature of CCP, the deposition of device-grade thin films at a higher rate cannot be achieved by simply raising the discharge power because a higher discharge power would result in more severe ion bombardment, which would lead to the deterioration of film quality.

One of the solutions to the problem mentioned above is to increase the applied frequency of PECVD, by which more electromagnetic power would be transferred to electrons and hence the fraction of electromagnetic power consumed by ions would be reduced. Consequently, the deposition rate can be improved substantially without compromising the film quality. Moreover, it needs to be mentioned that a higher frequency could improve the deposition rate more significantly. Nevertheless, the combination of higher frequency and larger electrode would lead to the problem of non-uniform plasma discharge caused by the standing wave effect.

Up to date, a number of techniques have been proposed to resolve the issue of non-uniform discharge induced by the standing wave effect. One of the existing techniques is to replace one of the parallel electrodes of conventional CCP with one having a concave space, which acts as a capacitor in series with the plasma region. The function of the concave space is to remove the excessive voltage higher than the lowest voltage over the powered electrode from the discharge region. However, the profile of the concave space must be designed according to the standing wave pattern that actually depends on a variety of parameters including the electrode dimensions, applied frequency, discharge gap and the number/locations of feed points. As a result, a new profile of the concave space is required if any of the parameters mentioned above is varied. More importantly, since this technique is based on the principle of moving the extra voltage higher than the lowest voltage over the powered electrode to the concave space, there is an upper bound for the frequency because the voltage will be entirely removed from the discharge region when the frequency is too high and a node is generate in the discharge region.

Another existing technique eliminates the standing wave effect by superposing two standing waves that are 90° out of phase in space and alternately generated in time. Nevertheless, this technique can only be operated in pulsed mode rather than in continuous-wave mode that is more commonly used for PECVD. In pulsed mode, the standing waves must be alternately generated in terms of time, such that unnecessary limitations for deposition processes might be imposed. For instance, for thin film silicon solar cell, it has been reported that pulsed mode results in not only a lower deposition rate of the silicon thin film, but also a poorer performance of conversion efficiency compared with continuous-wave mode.

As stated above, though a number of techniques in the art, such as the aforesaid resorts, can be applied to resolve the problem caused by the standing wave effect, yet the common shortcomings among these techniques still exist, which leads to the problem that they are only capable of generating uniform discharge in a narrow operation window.

SUMMARY OF THE INVENTION

The primary object of the present invention is to provide a technique capable of generating uniform large-area high-frequency plasma in a wider operation window and hence able to offer better flexibility. One of the main features of the present invention is that the discharge uniformity is improved by superposing two standing waves with different temporal and spatial patterns that are launched simultaneously.

In the present invention, the high frequency plasma apparatus includes a reaction chamber, a first electrode, a second electrode, a plasma discharge region, and a plurality of feed points. The first electrode and the second electrode are both located inside the reaction chamber. The plasma discharge region is located between the first electrode and the second electrode. The feed points are located at one of the first electrode and the second electrode so as to introduce high-frequency signals into the reaction chamber to further generate simultaneously a first standing wave and a second standing wave with different temporal and spatial patterns in the plasma discharge region. By adding the first standing wave and the second standing wave in a superposition manner, discharge uniformity of the high frequency plasma can be effectively improved.

In the present invention, another high frequency plasma apparatus includes also a reaction chamber, a first electrode, a second electrode, a plasma discharge region, and a plurality of feed points. The first electrode and the second electrode are both located inside the reaction chamber. The plasma discharge region is located between the first electrode and the second electrode. The feed points are located at the first electrode and the second electrode so as to introduce high-frequency signals into the reaction chamber to further generate simultaneously a first standing wave and a second standing wave with different temporal and spatial patters in the plasma discharge region. By adding the first standing wave and the second standing wave in a superposition manner, discharge uniformity of the high frequency plasma can be effectively improved.

One of the advantages for the high-frequency plasma apparatus disclosed in the present invention is that its ability to generate uniform plasma would not be compromised by any change in the operating parameters as long as the superposition of the two standing waves is equivalent to a traveling wave or a quasi-traveling wave. Another advantage is that it can be operated in both continuous-wave and pulsed modes since the two standing waves are launched simultaneously. In pulsed mode, the applied standing waves appear and disappear at the same time.

With the advantages mentioned above, the present invention is able to overcome the shortcomings of the existing techniques.

All these objects are achieved by the apparatus of high frequency plasma described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an apparatus of high frequency plasma. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1A:
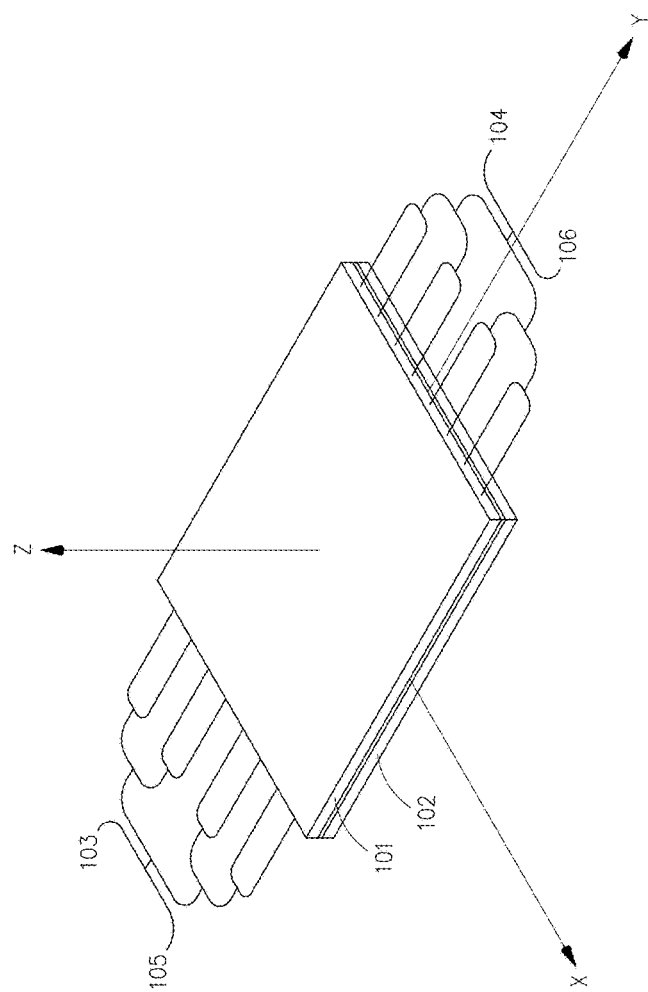
FIG. 1A is a schematic view of an embodiment of the high frequency plasma apparatus in accordance with the present invention.
Figure 1B:
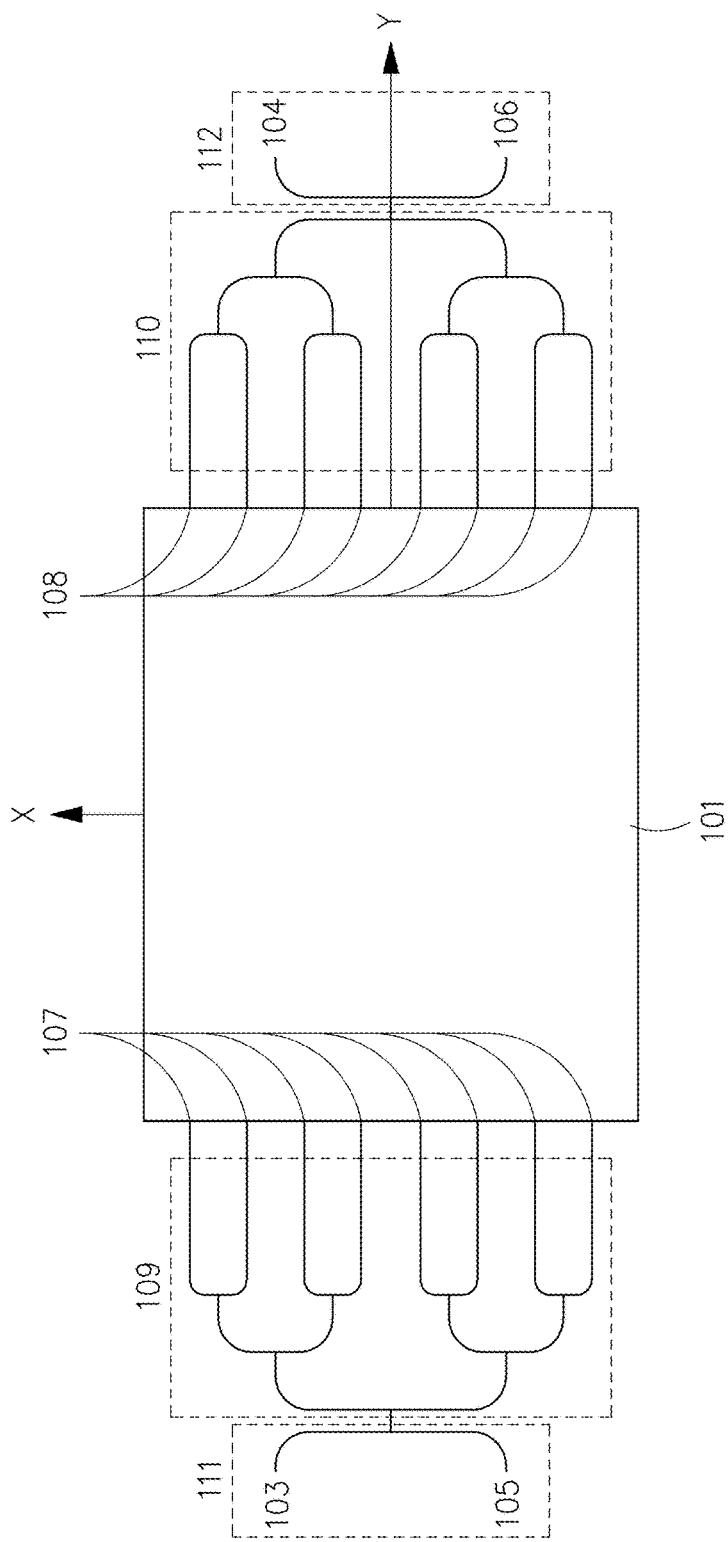
FIG. 1B is a top view of the first electrode of FIG. 1A.

Refer now to FIG. 1A and FIG. 1B; where FIG. 1A is a schematic view of an embodiment of the high frequency plasma apparatus in accordance with the present invention, and FIG. 1B is a top view of the first electrode of FIG. 1A.

As shown in FIG. 1A and FIG. 1B, this embodiment includes a first electrode 101, a second electrode 102, a plurality of feed points 103~108, two power dividers 109, 110 and two power combiners 111, 112.

Referring now to FIG. 1A, the first electrode 101 is parallel to the second electrode 102, the first electrode 101 is connected to the power supply, and the second electrode 102 is grounded.

The feed points 103, 105 are located at one side of the first electrode 101, while the feed points 104, 106 are located at another side of the first electrode 101. In this embodiment, the high-frequency input signals are introduced into the chamber via the feed points 103~106, while the feed points 103, 104 are to generate the first standing wave, and the feed points 105, 106 are to generate the second standing wave. Upon such an arrangement, by adding the first standing wave and the second standing wave in a superposition manner, the electric field distribution in the propagation direction of the electromagnetic wave (i.e. the Y direction in FIG. 1A) can be adjusted.

Referring now to FIG. 1B, the feed points 107, 108 are to improve the uniformity of the electric field in the direction (i.e. the X direction in FIG. 1B) perpendicular to the propagation direction of the electromagnetic wave. In addition, when the number and the locations of the feed points 107, 108 are adequately arranged, the standing wave effect in the X direction can be neglected.

It shall be noted that, in this embodiment, the feed points 107, 108 for generating the first standing wave and the second standing wave are all mounted to the lateral sides of the first electrode 101. However, in some other embodiments of the present invention not shown herein, a first part of the feed points can be mounted to at least one of the lateral sides of the first electrode 101 and a second part of the feed points are located on the top or the bottom of the first electrode 101.

The power dividers 109, 110 are individually to distribute power evenly to a number of feed points, namely, 107, 108. The power combiners 111, 112 are individually to combine the corresponding high-frequency signals from the feed points 103, 105 and the feed points 104, 106, respectively.

Figure 2A:
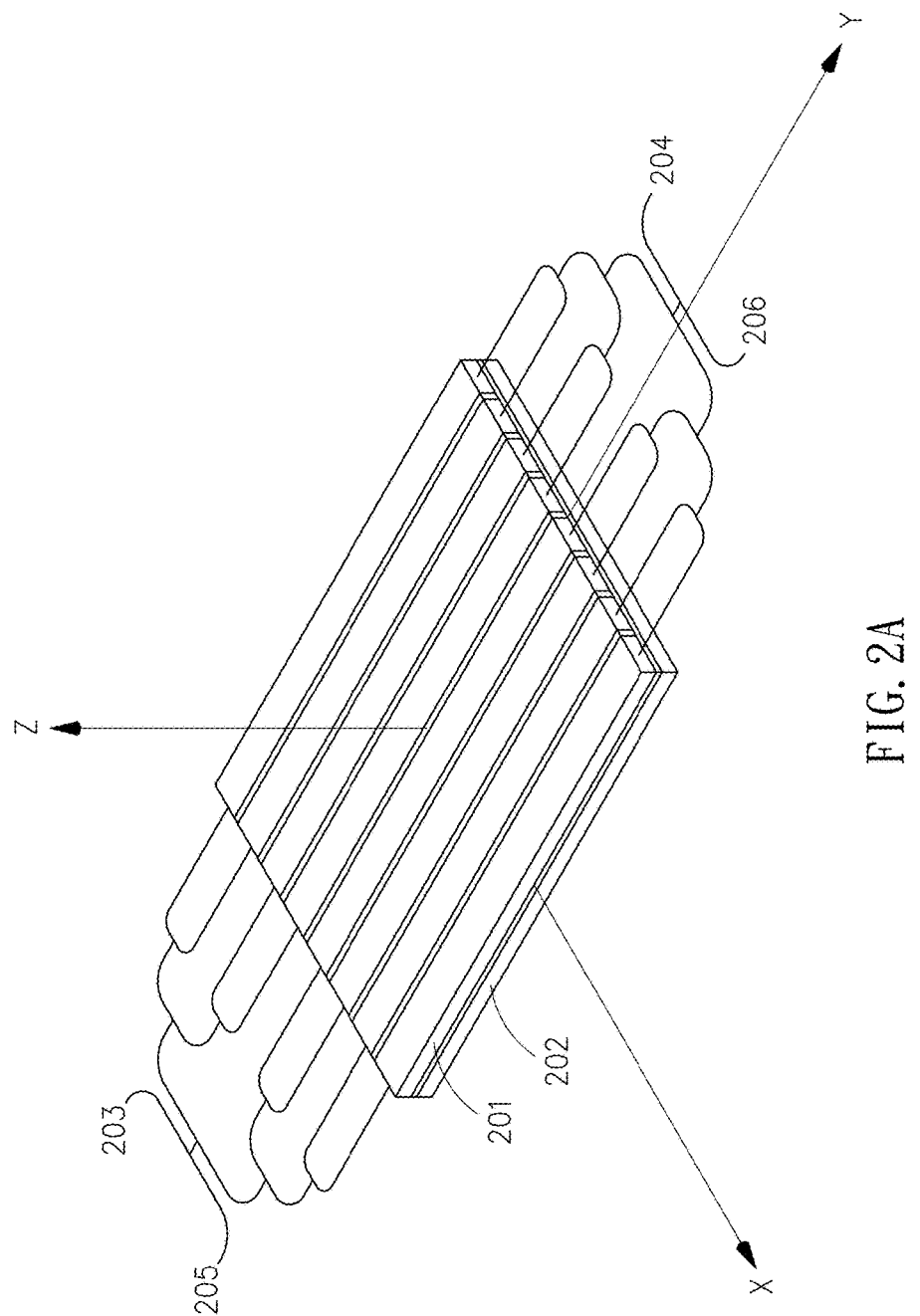
FIG. 2A is a schematic view of another embodiment of the high frequency plasma apparatus in accordance with the present invention.
Figure 2B:
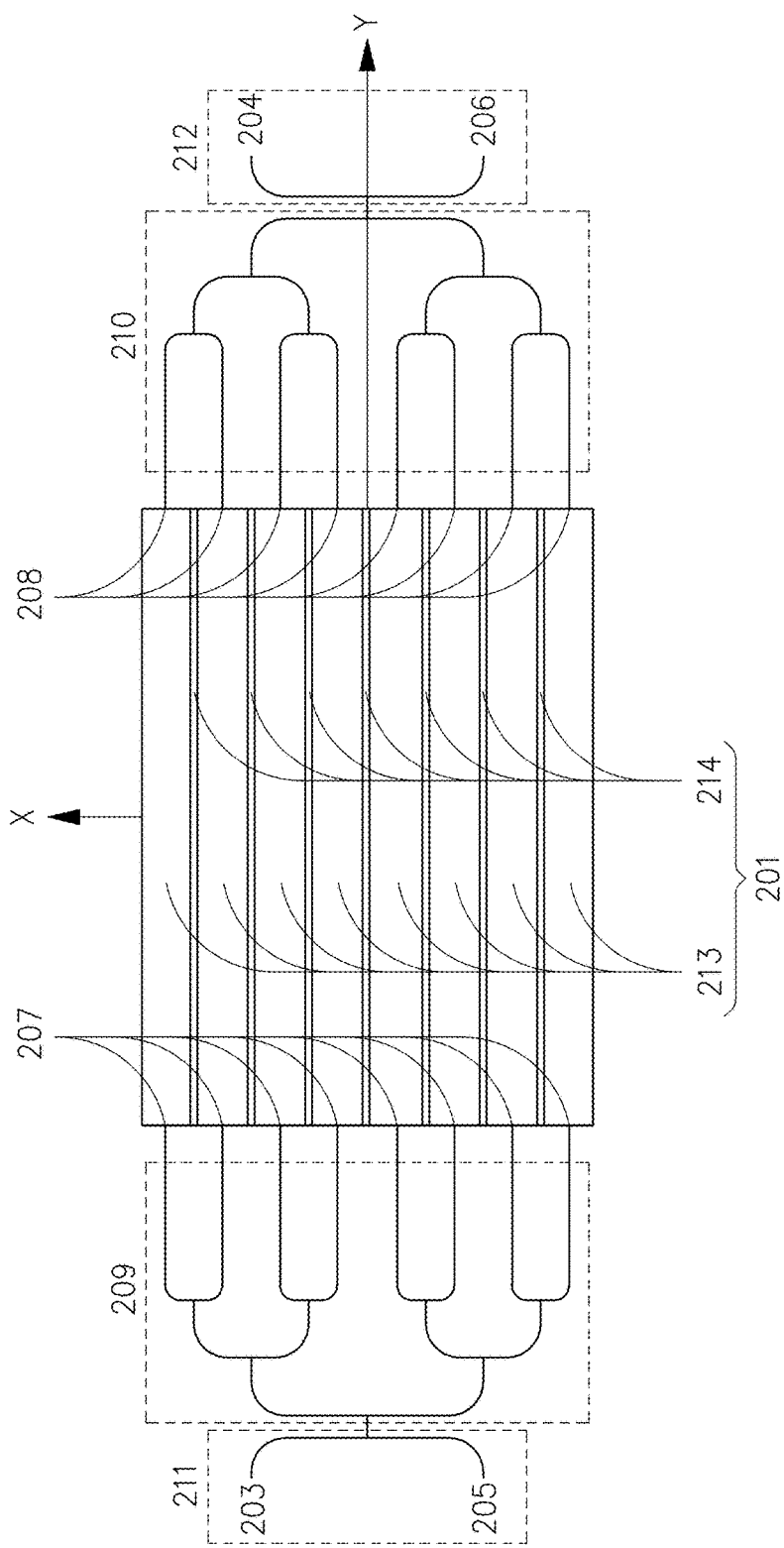
FIG. 2B is a top view of the first electrode of FIG. 2A.

Refer now to FIG. 2A and FIG. 2B; where FIG. 2A is a schematic view of another embodiment of the high frequency plasma apparatus in accordance with the present invention, and FIG. 2B is a top view of the first electrode of FIG. 2A.

As shown in FIG. 2A and FIG. 2B, this embodiment includes a first electrode 201, a second electrode 202, a plurality of feed points 203~208, two power dividers 209, 210, and two power combiners 211, 212.

Referring now to FIG. 2A, the first electrode 201 is parallel to the second electrode 202, the first electrode 201 is connected to the power supply, and the second electrode 202 is grounded.

The feed points 203, 205 are located at one side of the first electrode 201, while the feed points 204, 206 are located at another side of the first electrode 201. In this embodiment, the high-frequency input signals are introduced into the chamber via the feed points 203~206, while the feed points 203, 204 are to generate the first standing wave, and the feed points 205, 206 are to generate the second standing wave. Upon such an arrangement, by adding the first standing wave and the second standing wave in a superposition manner, the electric field distribution in the propagation direction of the electromagnetic wave (i.e. the Y direction in FIG. 2A) can be adjusted.

Referring now to FIG. 2B, the first electrode 201 includes a plurality of metallic electrode plates 213 and a plurality of insulators 214. Each of the metallic electrode plates 213 is parallel to the neighboring metallic electrode plate 213. Each single insulator 214 is located between two neighboring metallic electrode plates 213. In the present invention, the insulator 214 can be made of, but not limited to, quartz, glass, Teflon.

The feed points 207, 208, individually connected to perform as feed points of the corresponding metallic electrode plates 213, are to improve the electric field distribution in the direction (i.e. the X direction in FIG. 2B) perpendicular to the propagation direction of the electromagnetic wave. In addition, when the number and the locations of the feed points 207, 208 are adequately arranged, the standing wave effect in the X direction can be neglected.

It shall be noted that, in this embodiment, the feed points 207, 208 for generating the first standing wave and the second standing wave are all mounted to the lateral sides of the first electrode 201. However, in some other embodiments of the present invention not shown herein, a first part of the feed points can be mounted to at least one of the lateral sides of the first electrode 201 and a second part of the feed points are mounted to the top or the bottom of the first electrode 201.

The power dividers 209, 210 are individually to distribute power evenly to a number of feed points, namely, 207, 208. The power combiners 211, 212 are individually to combine the corresponding high-frequency signals from the feed points 203, 205 and the feed points 204, 206, respectively.

Figure 3A:
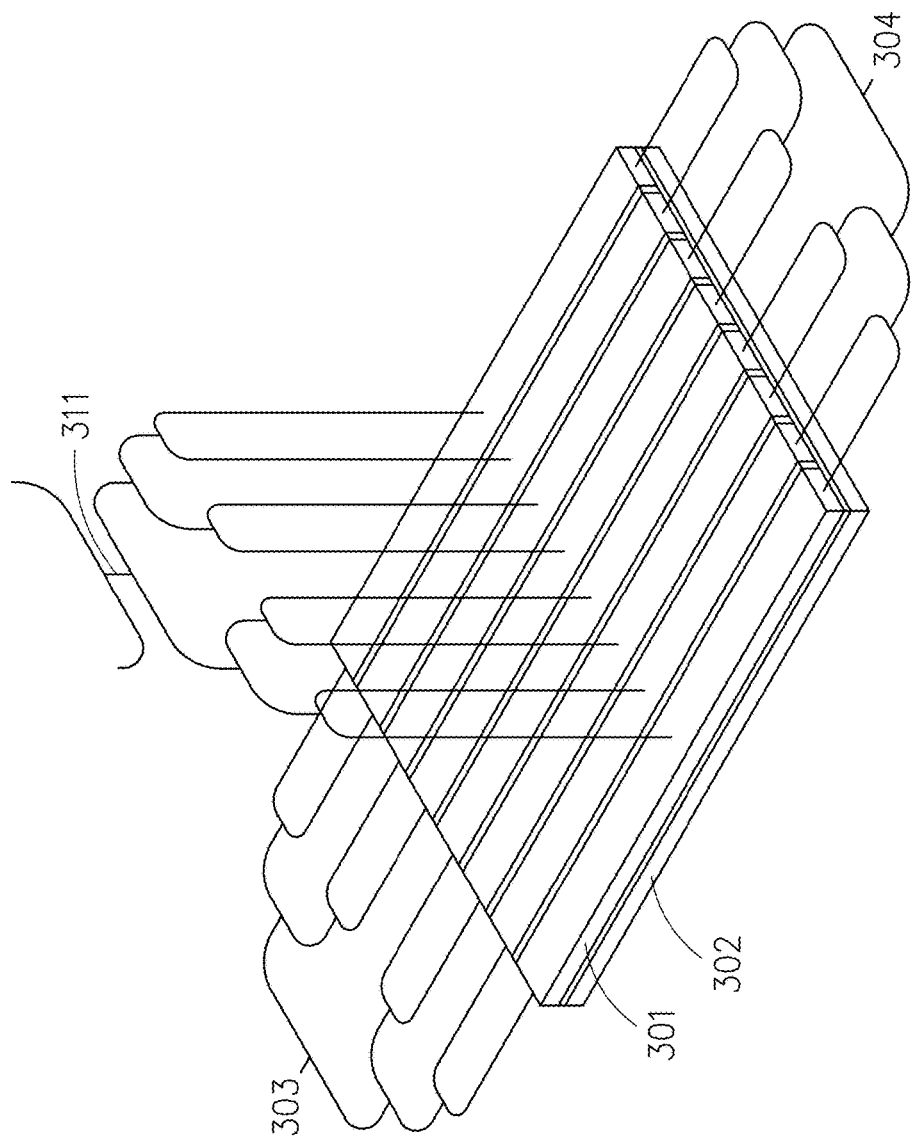
FIG. 3A is a schematic view of a further embodiment of the high frequency plasma apparatus in accordance with the present invention.
Figure 3B:
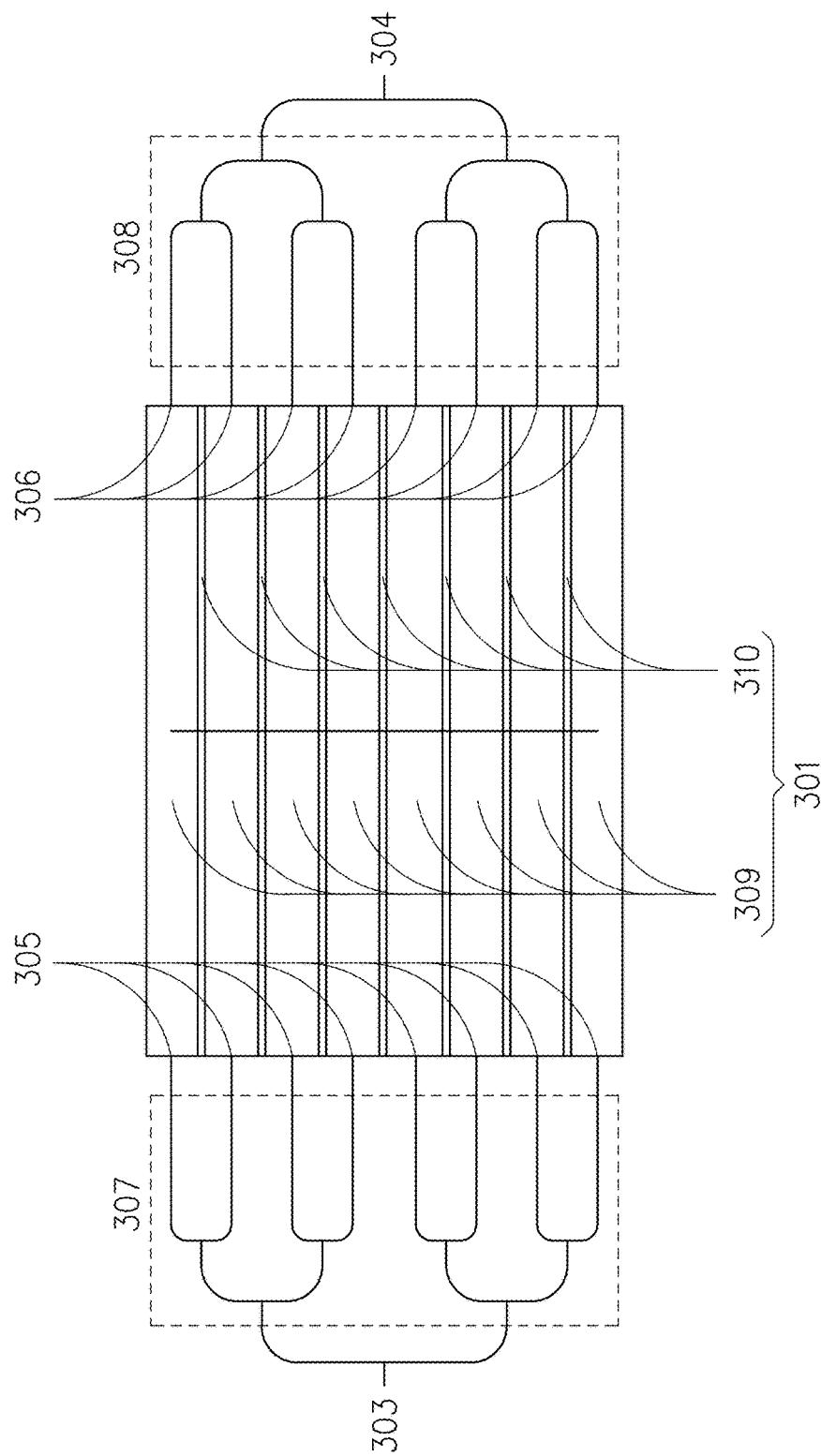
FIG. 3B is a top view of the first electrode of FIG. 3A.
Figure 3C:
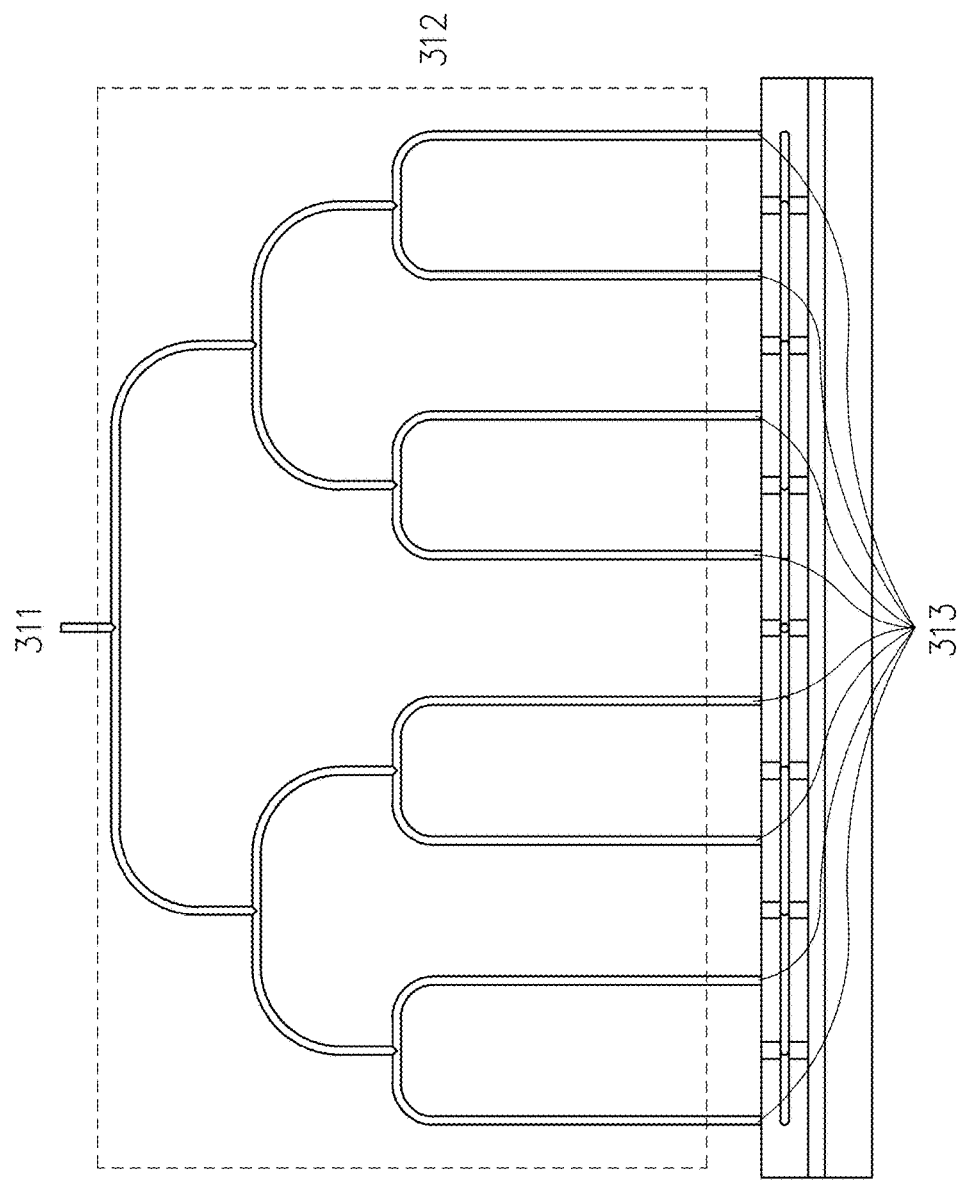
FIG. 3C is a side view of the first electrode of FIG. 3A.

Refer now to FIG. 3A, FIG. 3B and FIG. 3C; where FIG. 3A is a schematic view of a further embodiment of the high frequency plasma apparatus in accordance with the present invention, FIG. 3B is a top view of the first electrode of FIG. 3A, and FIG. 3C is a side view of the first electrode of FIG. 3A.

As shown in FIG. 3A and FIG. 3B, this embodiment includes a first electrode 301, a second electrode 302, a plurality of feed points 303, 304, 305, 306, 311, 313 and three power divider 307, 308, 312.

Referring now to FIG. 3A, the first electrode 301 is parallel to the second electrode 302, the first electrode 301 is connected to the power supply, and the second electrode 302 is grounded. The feed point 303 is located at one side of the first electrode 301, while the feed point 304 is located at another side of the first electrode 301. In this embodiment, the high-frequency input signals used to generate the first standing wave are introduced into the chamber via the feed points 303, 304.

Referring now to FIG. 3B, the first electrode 301 includes a plurality of metallic electrode plates 309 and a plurality of insulators 310. Each of the metallic electrode plates 309 is parallel to the neighboring metallic electrode plate 309. Each single insulator 310 is located between two neighboring metallic electrode plates 309. In the present invention, the insulator 310 can be made of, but not limited to, quartz, glass, Teflon.

The feed points 305, 306, individually perform as feed points of the corresponding metallic electrode plates 309, are to improve the electric field distribution in the direction perpendicular to the propagation direction of the electromagnetic wave. As the number and the locations of the feed points 305, 306 are adequately arranged, the standing wave effect in the direction perpendicular to the propagation direction of the electromagnetic wave can be neglected.

It shall be noted that, in this embodiment, the feed points 305, 306 for generating the first standing wave are all mounted to the lateral sides of the first electrode. However, in some other embodiments of the present invention not shown herein, a first part of the feed points can be mounted to at least one of the lateral sides of the first electrode 301 and a second part of the feed points can be mounted to the top or the bottom of the first electrode 301.

The power dividers 307, 308 are individually to distribute power evenly to a number of power-feeding points, namely, 305, 306.

Referring now to FIG. 3C, the feed points 311, 313 are on top of the metallic electrode plate 309 of the first electrode 301. In this embodiment, the feed point 311 is the power-feeding point for generating the second standing wave. The power divider 312 is to evenly divide the power of high-frequency signal introduced from the feed point 311 to a number of feed points, namely, 313.

It shall be noted that, in this embodiment, the feed point 311 for generating the second standing wave is on top of the first electrode 301. However, the aforesaid feed point can be also on the bottom of the first electrode.

Figure 4A:
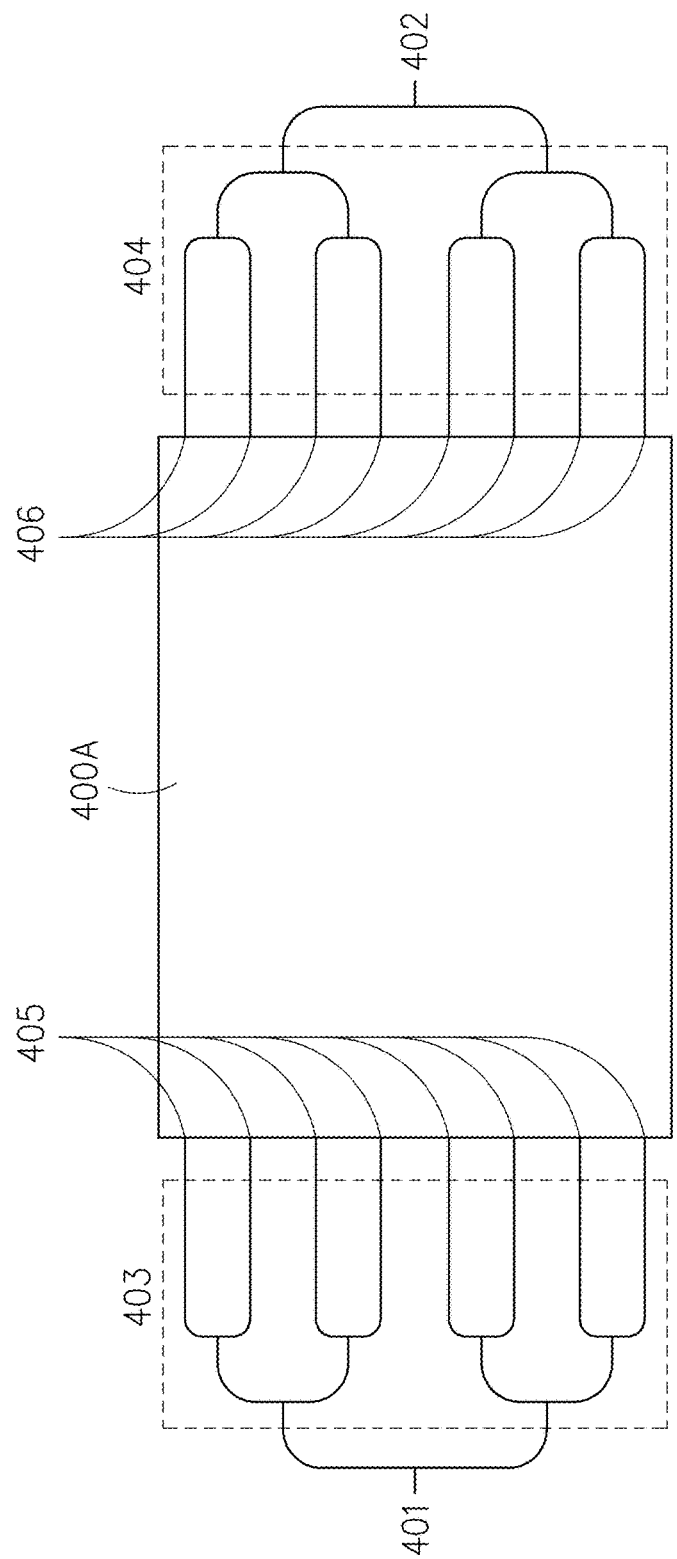
FIG. 4A is a schematic top view of the first electrode of one more embodiment of the high frequency plasma apparatus in accordance with the present invention.
Figure 4B:
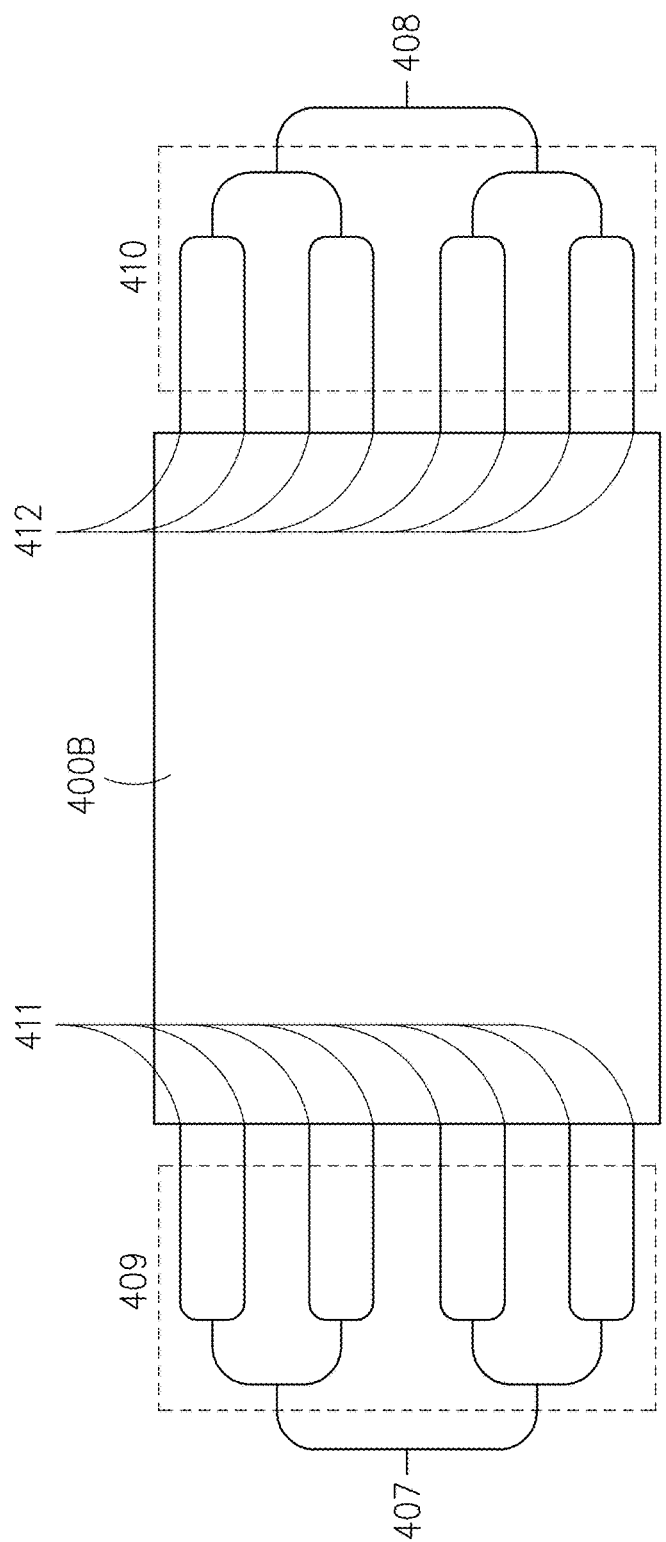
FIG. 4B is a schematic top view of the second electrode of the one more embodiment of the high frequency plasma apparatus in accordance with the present invention.

Refer now to FIG. 4A and FIG. 4B; where FIG. 4A is a schematic top view of the first electrode of one more embodiment of the high frequency plasma apparatus in accordance with the present invention, and FIG. 4B is a schematic top view of the second electrode of the one more embodiment of the high frequency plasma apparatus.

As shown in FIG. 4A and FIG. 4B, this embodiment includes a first electrode 400A, a second electrode 400B, a plurality of feed points 401, 402, 405, 406, 407, 408, 411, 412 and four power dividers 403, 404, 409, 410.

In this embodiment, the first electrode 400A and the second electrode 400B are both connected to the power supply.

As shown in FIG. 4A, the feed points 401, 402, located on the lateral sides of the first electrode 400A, are the power-feeding points for generating the first standing wave. The feed points 405, 406, located on the lateral sides of the first electrode 400A, are to improve the electric field distribution in the direction perpendicular to the propagation direction of the electromagnetic wave. As the number and the locations of the feed points 405, 406 are adequately arranged, the standing wave effect in the direction perpendicular to the propagation direction of the electromagnetic wave can be neglected. The power dividers 403 and 404 are to distribute the power evenly to the feed points corresponding to 405 and 406, respectively.

It shall be noted that, in this embodiment, the feed points 405, 406 for generating the first standing wave are on the lateral sides of the first electrode 400A. In the present invention, the feed points can be on the top or the bottom of the first electrode.

As shown in FIG. 4B, the feed points 407, 408 on the lateral sides of the second electrode 400B are the power-feeding points for producing the second standing wave. The feed points 411, 412 on the lateral sides of the second electrode 400B are to improve the electric field distribution in the direction perpendicular to the propagation direction of the electromagnetic wave. As the number and the locations of the feed points 411, 412 are adequately arranged, the standing wave effect in the direction perpendicular to the propagation direction of the electromagnetic wave can be neglected. The power dividers 409 and 410 are to distribute the power evenly to the feed points 411 and 412, respectively.

It shall be noted that, in this embodiment, the feed points 411, 412 for generating the second standing wave are on the lateral sides of the second electrode. However, in some other embodiments of the present invention not shown herein, the feed points can be mounted on the top or the bottom of the second electrode.

Figure 5A:
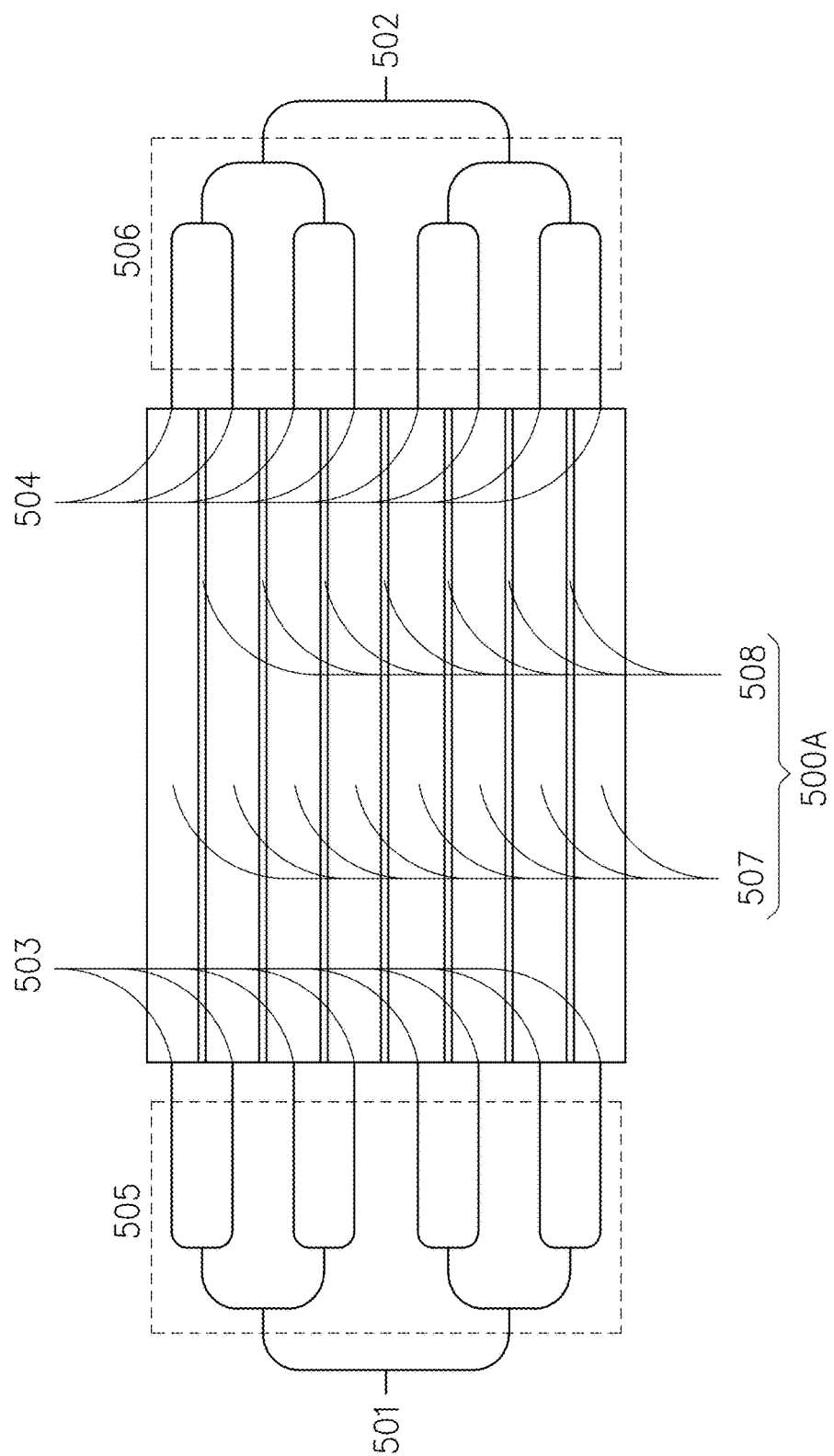
FIG. 5A is a schematic top view of the first electrode of one alternative embodiment of the high frequency plasma apparatus in accordance with the present invention.
Figure 5B:
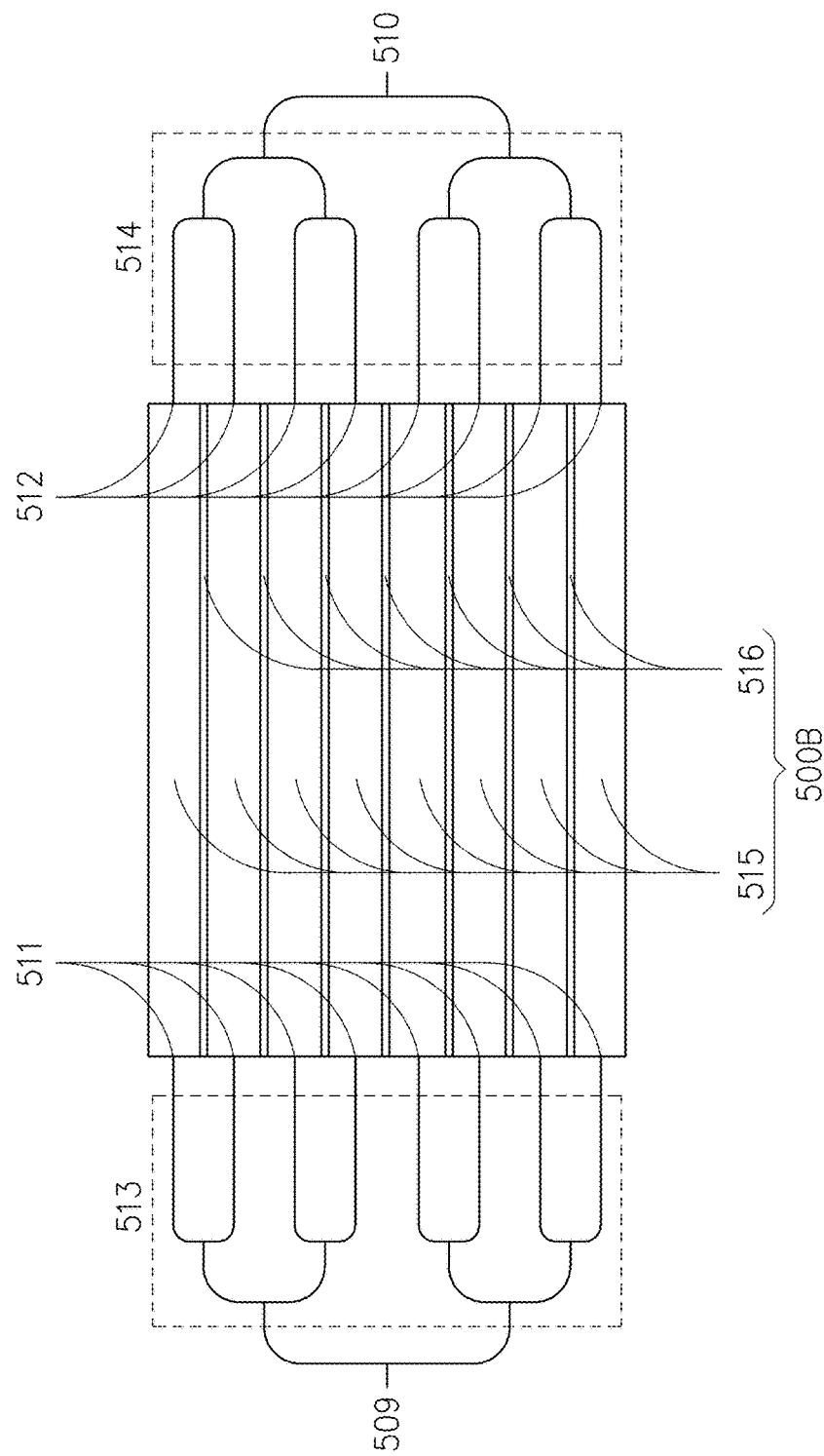
FIG. 5B is a schematic top view of the second electrode of the one alternative embodiment of the high frequency plasma apparatus in accordance with the present invention.

Refer now to FIG. 5A and FIG. 5B; where FIG. 5A is a schematic top view of the first electrode of one alternative embodiment of the high frequency plasma apparatus in accordance with the present invention, and FIG. 5B is a schematic top view of the second electrode of the second embodiment of the one alternative embodiment of the high frequency plasma apparatus.

As shown in FIG. 5A and FIG. 5B, this embodiment includes a first electrode 500A, a second electrode 500B, a plurality of feed points 501, 502, 503, 504, 509, 510, 511, 512 and four power dividers 505, 506, 513, 514.

In this embodiment, the first electrode 500A and the second electrode 500B are both connected to the power supply.

As shown in FIG. 5A, the first electrode 500A includes a plurality of metallic electrode plates 507 and a plurality of insulators 508, in which the metallic electrode plates 507 are all in parallel.

The insulator 508 sandwiched between two neighboring metallic electrode plates 507 can be made of, but not limited to, quartz, glass, Teflon.

The feed points 501, 502 located on the lateral sides of the first electrode 500A are the power-feeding points for generating the first standing wave.

The feed points 503, 504 located on the lateral sides of the metallic electrode plate 507 are to improve the electric field distribution in the direction perpendicular to the propagation direction of the electromagnetic wave. As the number and the locations of the feed points 503, 504 are adequately arranged, the standing wave effect in the direction perpendicular to the propagation direction of the electromagnetic wave can be neglected. The power dividers 505 and 506 are to distribute the power evenly to the feed points 503 and 504, respectively.

It shall be noted that, in this embodiment, the feed points 503, 504 for generating the first standing wave are all mounted on the lateral sides of the first electrode. However, in some other embodiments of the present invention not shown herein, a first part of the feed points can be on at least one of the lateral sides of the first electrode and a second part of the feed points are on the top or the bottom of the first electrode.

As shown in FIG. 5B, the second electrode 500B includes a plurality of metallic electrode plates 515 and a plurality of insulators 516, in which the metallic electrode plates 515 are all in parallel.

The insulator 516 sandwiched between two neighboring metallic electrode plates 515 can be made of, but not limited to, quartz, glass, Teflon.

The feed points 509, 510 on the lateral sides of the second electrode 500B are the power-feeding points for generating the second standing wave.

The feed points 511, 512 on the lateral sides of the metallic electrode plate 515 are to improve the electric field distribution in the direction perpendicular to the propagation direction of the electromagnetic wave. As the number and the locations of the feed points 511, 512 are adequately arranged, the standing wave effect in the direction perpendicular to the propagation direction of the electromagnetic wave can be neglected. The power dividers 513 and 514 are to distribute the power evenly to the feed points 511 and 512, respectively.

It shall be noted that, in this embodiment, the feed points 511, 512 for generating the second standing wave are all on the lateral sides of the second electrode. However, in some other embodiments of the present invention not shown herein, a first part of the feed points can be on at least one of the lateral sides of the second electrode and a second part of the feed points are on the top or the bottom of the second electrode.

Figure 6:
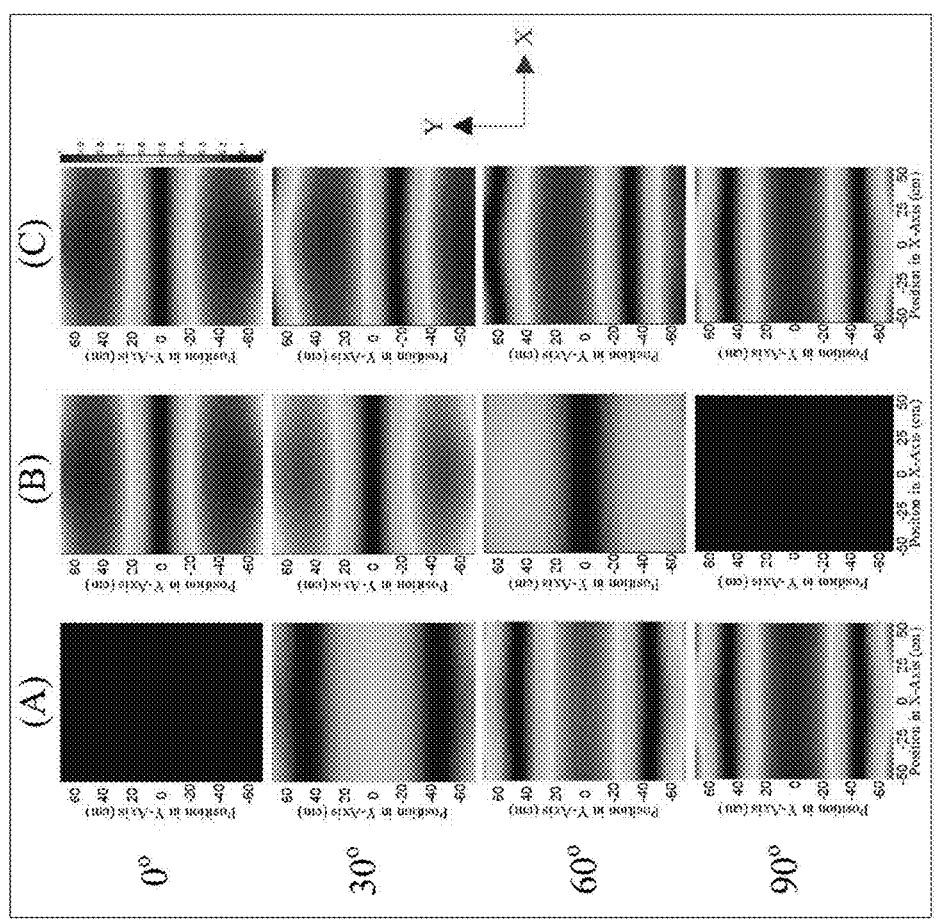
FIG. 6 demonstrates the variation of electric field distributions with time for the embodiment presented FIG. 1A, in which columns (A), (B) and (C) stand respectively for the cases with the first standing wave alone, the second standing wave alone and the superposition of the first standing wave and the second standing wave.

FIG. 6 shows the variation of simulated electric field distributions with time. In FIG. 6, the horizontal axis presents the position (cm) in the X direction, and the vertical axis stands for the position (cm) in the Y direction. The length and width of the electrodes are 1.6 and 1.3 m, respectively. The applied frequency is 80 MHz. The medium between the two electrodes is assumed to be a lossless medium with a relative permittivity of 4. The wavelength of the electromagnetic wave in the medium is 50% of that in vacuum.

The X and Y directions of FIG. 6 are consistent with those of FIG. 1A. Columns (A), (B) and (C) of FIG. 6 stands for the instant electric field distributions at different phases for the cases with the first stand wave alone, the second standing wave alone, and both the first standing wave and the second standing wave, respectively.

It is noted that, in FIG. 6, column (C) demonstrates the superposition of the first standing wave and the second standing wave represented by columns (A) and (B), respectively. From columns (A) and (B), it is known that the temporal and spatial phase differences between the first standing wave and the second standing wave are both 90°. In addition, in the simulation, it is confirmed that the amplitudes for these two standing waves are the same. The electric field distributions shown in columns (A), (B) and (C) are all normalized based on the amplitude. As shown, when only the first standing wave or the second standing wave is applied, the electric field distribution is extremely non-uniform. However, as shown in column (C) of FIG. 6, the pattern of the electromagnetic wave has been transformed from a standing wave shown in column (A) or column (B) to a traveling wave.

Figure 7:
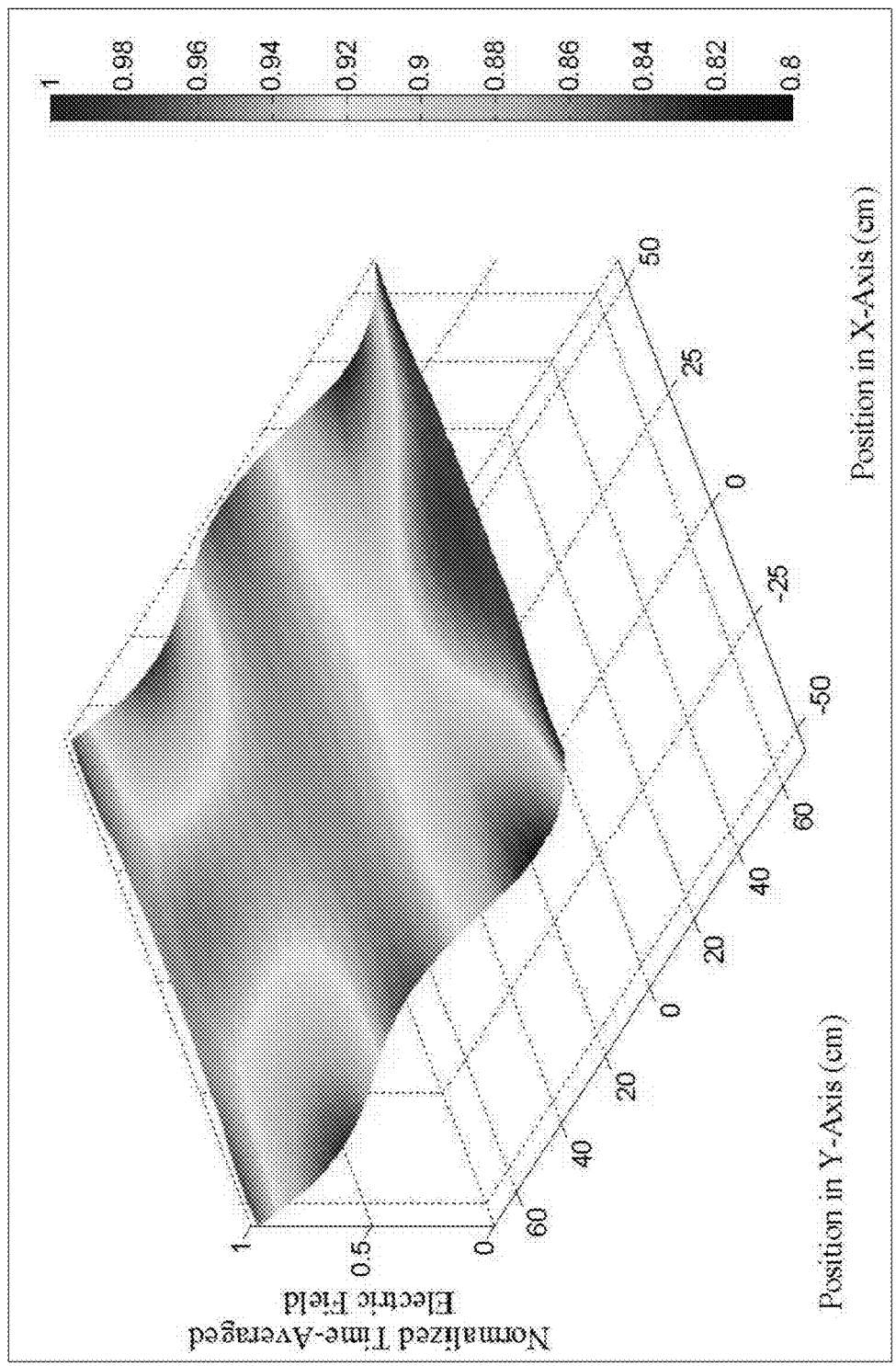
FIG. 7 is a normalized time-averaged electric field distribution upon column (C) of FIG. 6.

FIG. 7 shows the normalized time-averaged electric field distribution upon column (C) of FIG. 6. In FIG. 7, the X axis stands for the position (cm) in the X direction, and the Y axis stands for the position (cm) in the Y direction. According to the results given in FIG. 7, the non-uniformity of electric field is <±10%. The non-uniformity of electric field is determined by (the maximum electric field−the minimum electric field)/(the maximum electric field+the minimum electric field). The non-uniformity can be further improved by varying the number/locations of the feed points 107, 108 and the grounding design of the second electrode 102.

In column (A) of FIG. 6, the input signals for the generation of the first standing wave that are introduced into the chamber from opposite sides of the first electrode are in phase. Accordingly, an anti-node can be observed at the center of electrode. On the contrary, in column (B) of FIG. 6, the input signals for the second standing wave are out of phase by 180° and hence a node is located at the center of electrode instead. As can be seen in columns (A) and (B) of FIG. 6, the first standing wave and the second standing wave are out of phase by 90° both in time and space.

According to the present invention, a travelling wave can be produced when the anti-node of the first standing wave aligns with the node of the second standing wave and vise versa. Nonetheless, it needs to be emphasized that the antinode and node of the applied standing waves do not have to be at the center of the electrode.

Moreover, it shall be noted that the feasibility of the present invention is not limited to the parameters used in the simulation shown in FIG. 6 and FIG. 7. Taking the embodiment shown in FIG. 1A and FIG. 1B for example, when any of the operating parameters, such as applied frequency, electrode dimensions, discharge gap, pressure, gas compositions and temperature, changes, the electric field distribution along the direction perpendicular to the propagation of electromagnetic wave can be improved by varying the arrangement of the feed points 107, 108 and the grounding design, while the uniformity of the electric field in the direction parallel with the propagation of electromagnetic wave can be improved by superposing the first standing wave and the second standing wave.

In addition, since the first standing wave and the second standing wave of the present invention are generated simultaneously, continuous-wave mode and pulsed mode are both applicable. The former means that the high-frequency signals are provided continuously during the operation, while the latter indicates that the two standing waves appear and disappear at the same time during the operation.

Figure 8A:
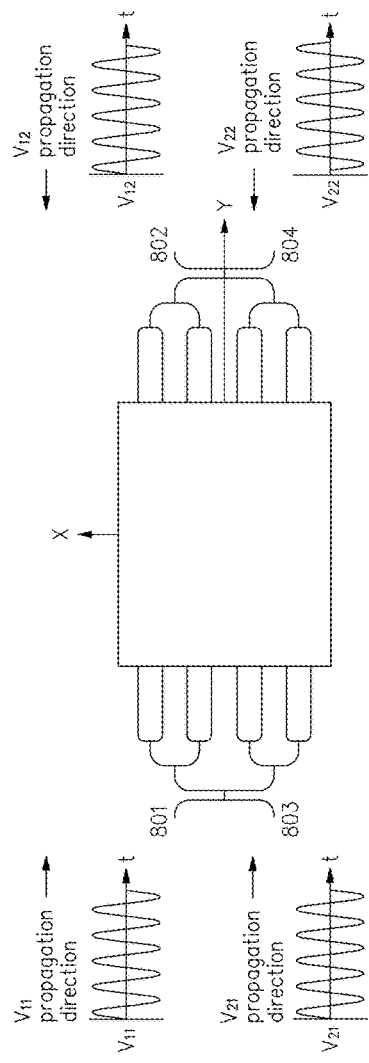
FIG. 8A shows schematically an embodiment of the high frequency plasma apparatus in accordance with the present invention, operated in continuous-wave mode.
Figure 8B:
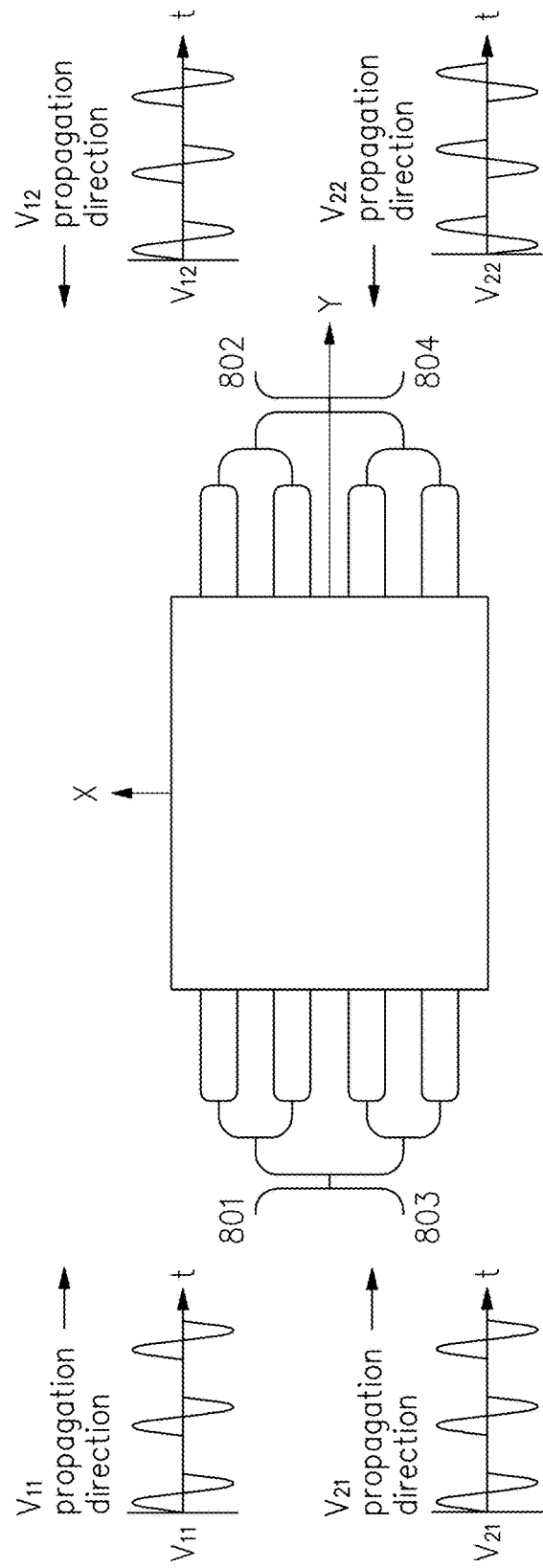
FIG. 8B shows schematically an embodiment of the high frequency plasma apparatus in accordance with the present invention, operated in pulsed mode.

FIG. 8A and FIG. 8B are examples for the present invention operated in continuous-wave and pulsed modes, respectively. As shown, $V_{11}$, $V_{12}$, $V_{21}$ and $V_{22}$ stand respectively for the high-frequency signals introduced from the power-feeding points 801, 802, 803 and 804. The $V_{11}$ and $V_{12}$ are to form the first standing wave, while the $V_{21}$ and $V_{22}$ are to form the second standing wave. The waveforms and propagation directions of $V_{11}$, $V_{12}$, $V_{21}$ and $V_{22}$ are shown in FIG. 8A and FIG. 8B as well. In FIG. 8A, $V_{11}$, $V_{12}$, $V_{21}$ and $V_{22}$ are all continuous waves. On the other hand, $V_{11}$, $V_{12}$, $V_{21}$ and $V_{22}$ are all pulse waves in FIG. 8B.

The viability of the present invention is not simply limited to the aforesaid embodiments. It is understood that the present invention can be applied to any high-frequency plasma apparatus, in which the discharge uniformity is improved by superposing two standing waves with different temporal and spatial patterns that are generated at the same time. Furthermore, the high-frequency signals can be in arbitrary waveforms, such as triangular, square and sinusoidal waves. Additionally, the singles for the formation of the first standing wave and the second standing wave can be from the identical power supply or different power supplies. For the latter, the power supplies can be operated synchronously or asynchronously.

Figure 9:
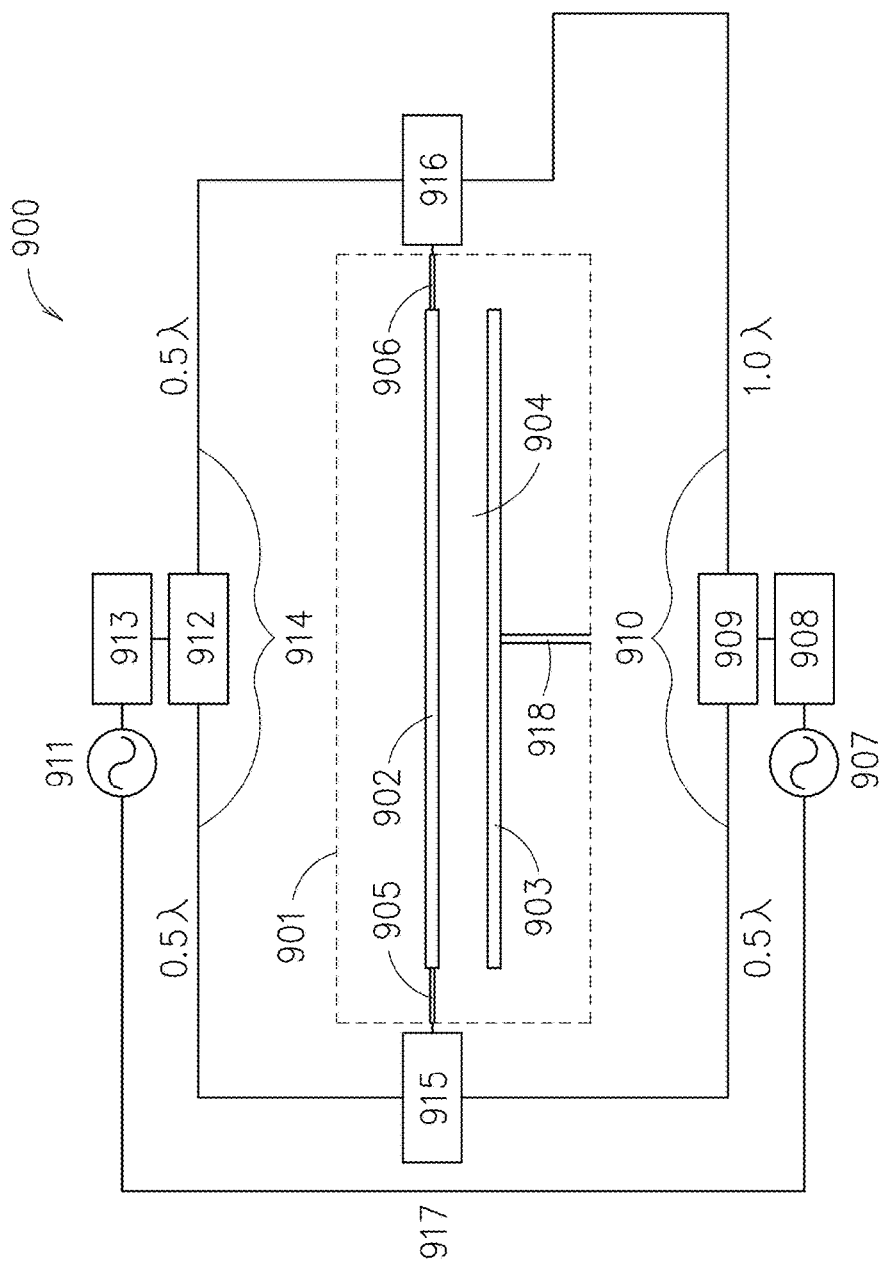
FIG. 9 is a schematic view of the high-frequency plasma system in accordance with the embodiment shown in FIG. 1A.

FIG. 9 is a schematic view of the high-frequency plasma system in accordance with the embodiment shown in FIG. 1A In this embodiment, the high frequency plasma apparatus 900 includes a plasma reaction chamber 901, a first electrode 902, a second electrode 903, a plasma discharge region 904, a plurality of feed points 905, 906, two power supplies 907, 911, two matching boxes 908, 913, two power dividers 909, 912, a plurality of transmission lines 910, 914, two power combiners 915, 916, a device for synchronization 917 and a ground connection 918.

In this embodiment, the first electrode 902 and the second electrode 903 are inside the plasma chamber 901. The first electrode 902 is parallel to the second electrode 903. The plasma discharge region 904 is between the first electrode 902 and the second electrode 903.

The feed points 905, 906 herein include the aforesaid feed points 107, 108 and the aforesaid power dividers 109, 110 of FIG. 1B.

The power supplies 907, 911 are utilized to generate the first standing wave and the second standing wave, respectively. As the high-frequency signals for producing the first standing wave and the second standing wave are from different power supplies, the power supplies can be operated in a synchronous or asynchronous manner. The frequency of the high-frequency signal can be in HF (high frequency, 3~30 MHz), VHF (very high frequency, 30~300 MHz) or UHF (ultra high frequency, 300~3000 MHz) band. The matching boxes 908 and 913 are connected with the power supplies 907 and 977, respectively. However, it should be noted that, in another embodiment not given in the present invention, the first standing wave and the second standing wave can be produced simultaneously by a single power supply.

The power dividers 909 and 912 are to generate the first standing wave and the second standing wave, respectively. The spatial patterns of the first standing wave and the second standing wave depend on the phases differences between the input signals introduced on the opposite sides of the first electrode 901. The phase differences between the input signals can be controlled by adjusting the lengths of the transmission lines 910, 914. However, the same purpose can be achieved by using a phase shifter or any other circuit or device with the same function. The power combiners 915, 916 are used to combine the high-frequency input signals for the generation of the first standing wave and the second standing wave. The synchronization device 917 is to synchronize the input signals from different power supplies (e.g., the power supplies 907, 911 in FIG. 9). The ground connection 918 is for the grounding of the second electrode 903 and can be designed based on the distribution of electric field.

It shall be understood that the plasma system containing the high frequency plasma apparatus of the present invention is not limited to the embodiment shown in FIG. 9. Other variations based on the aforesaid teaching are still within the scope of the present invention. For example, the feed points 905, 906 are not limited to the lateral sides of the first electrode 902, and the grounding of the second electrode 903 is not always necessary. Furthermore, in the case that the high-frequency signals for producing the first standing wave and the second standing wave are from different power supplies, these power supplies can be operated asynchronously as well.

In the case that the first standing wave and the second standing wave have the same amplitude and are 90° out of phase in both the time and space, a traveling wave can be generated. The temporal and spatial phase differences can be one of the combinations of 90°/90°, −90°/−90°, 90°/−90° and −90°/90°.

In the case that the first standing wave and the second standing wave have similar amplitudes and are out of phase by 70°~110° in both the time and space, a quasi-traveling wave can be generated. The temporal and spatial phase differences can be one of the combinations of 70°~110°/70°~110°, −70°~−110°/−70°~−110°, 70°~110°/−70°~−110° and −70°~−110°/70°~110°.

As described above, when the two standing waves have the same amplitude and are 90° out of phase in both time and space, the superposition of the two standing waves would generate a traveling wave. Once a traveling wave can be generated, the optimal plasma uniformity can be obtained. However, when the two standing waves have similar amplitudes and both the temporal and spatial phase differences do not deviate from 90° significantly, the superposition of the two standing waves would form a quasi-traveling wave. It should be emphasized that, in most industrial applications, the non-uniformity of thin film deposition do not have to be ±0%. For instance, the typical requirements for the solar cell and the flat display panel industries are ±10% and ±5%, respectively. Hence, the quasi-traveling wave may still be able to satisfy the industrial requirements.

For sinusoidal high-frequency signals propagating in Cartesian coordinate system, the standing wave can also be expressed by a sinusoidal function. As the two standing waves have the same amplitudes and are 90° out of phase in both time and space, the superposition of the two standing waves would generate a traveling wave. In such a case, the temporal and spatial phase differences can be one of the combinations of 90°/90°, −90°/−90°, 90°/−90° or −90°/90°. The signs of the temporal and spatial phase differences only affect the propagation direction of the traveling wave.

When the two standing waves match the aforesaid descriptions, by neglecting the initial temporal and spatial phases of each standing wave, the two standing waves with the temporal and spatial differences in the same signs can be expressed by the following two equations, where SW1 stands for the first standing wave and SW2 represents the second standing wave:

$$SW1: A \times \cos(\omega t) \times \cos(-kz) \quad (1)$$

$$SW2: A \times \cos(\omega t \pm 90°) \times \cos(-kz \pm 90°) \quad (2)$$

On the other hand, if the temporal and spatial phase differences are in different signs, the second standing wave can be expressed as:

$$SW2: A \times \cos(\omega t \pm 90°) \times \cos(-kz \mp 90°) \quad (3)$$

Here A stands for the amplitude of the corresponding standing wave, ω stands for the angular frequency of the electromagnetic wave, t stands for time, k stands for the propagation constant of the electromagnetic wave, and z stands for the position along the propagation direction. The superposition of Equations (1) and (2) is A×cos(ωt−kz), and the superposition of Equations (1) and (3) is A×cos(ωt+kz).

When expressed in mathematical forms, one of the characteristics of standing wave is that the temporal term (t) and spatial term (z) are in different sinusoidal terms. Hence, it is obvious that Equations (1)-(3) are all standing waves. On the other hand, the traveling wave is characterized by having the temporal and the spatial terms in the same sinusoidal term, Therefore, it can be concluded that the superposition of both Equations (1)/(2) and Equations (1)/(3) would generate a traveling wave. However, it is worth noting that the standing waves expressed by Equations (1)-(3) are not the only standing waves that are able to generate a traveling wave by superposition. As a matter of fact, a traveling wave can be produced by superposing any two standing waves having the same amplitude and 90° out of phase in both time and space.

In summary, for the high frequency plasma apparatus disclosed in the present invention, when the operating parameters vary, the wavelengths of the two standing waves would both change accordingly. However, once the amplitudes, the temporal phase difference and the spatial phase difference fulfill the descriptions provided in the present invention, a traveling wave or a quasi-traveling wave can still be generated. It implies that the ability to effectively improve the discharge uniformity will not be compromised by the change in operating parameters.

While the present invention has been particularly shown and described with reference to a preferred embodiment, it will be understood by those skilled in the art that various changes in form and detail may be without departing from the spirit and scope of the present invention.

What is claimed is:

1. A high frequency plasma apparatus, comprising:
   a reaction chamber;
   a first electrode and a second electrode, located inside the reaction chamber, wherein a shape of the first electrode and a shape of the second electrode are approximately square;
   a plasma discharge region, located between the first electrode and the second electrode; and
   a plurality of feed points, located at one of the first electrode and the second electrode so as to introduce high-frequency signals into the reaction chamber to further generate simultaneously a first standing wave and a second standing wave with different temporal and spatial patterns in the plasma discharge region,
   wherein at least two of the plurality of feed points are located at one lateral side of one of the first electrode and the second electrode; and
   wherein, by adding the first standing wave and the second standing wave in a superposition manner, discharge uniformity of the high frequency plasma is improved.

2. The high frequency plasma apparatus of claim 1, wherein the plurality of feed points used to generate the first standing wave and the second standing wave are all located at least one lateral side of one of the first electrode and the second electrode, or a first part of the plurality of feed points are located on at least one lateral side of one of the first electrode and the second electrode while a second part of the plurality of feed points are located on a top or a bottom of the electrode with the first part of the plurality of feed points; wherein another one of the first electrode and the second electrode without the feed points is either grounded or not grounded.

3. The high frequency plasma apparatus of claim 1, wherein the feed points to generate the first standing wave are located on at least one lateral side of one of the first electrode and the second electrode, the feed points to generate the second standing wave are located on a top, at least one lateral side or a bottom of the electrode with the feed points used to generate the first stand wave, and the electrode without the feed points is either grounded or not grounded.

4. The high frequency plasma apparatus of claim 1, wherein the high-frequency signals to generate the first standing wave and the second standing wave are from either the same power supply or different power supplies; wherein, when the high-frequency signals are from different power supplies, the power supplies are operated either synchronously or asynchronously; wherein frequencies of the high-frequency signals are within HF, VHF or UHF band.

5. The high frequency plasma apparatus of claim 1, wherein the first standing wave and the second standing wave generated simultaneously can be operated in a continuous-wave mode or a pulsed mode; wherein, in the pulsed mode, the first standing wave and the second standing wave appear and disappear simultaneously.

6. The high frequency plasma apparatus of claim 1, wherein, when the first standing wave and the second standing wave have the same amplitude and are 90° out of phase both in time and space, a traveling wave is generated; wherein the temporal and spatial phase differences can be one of the combinations of 90°/90°, −90°/−90°, 90°/−90° and −90°/90°.

7. The high frequency plasma apparatus of claim 1, wherein, when the first standing wave and the second standing wave have similar amplitudes and are 70°~110° out of phase both in time and space, a quasi-traveling wave is generated; wherein the temporal and spatial phase differences can be one of the combinations of 70°~110°/ 70°~110°, −70°~−110°/−70°~−110°, 70°~110°/−70°~−110° and −70°~−110°/70°~110°.

8. A high frequency plasma apparatus, comprising:
a reaction chamber;
a first electrode and a second electrode, located inside the reaction chamber, wherein a shape of the first electrode and a shape of the second electrode are approximately square;
a plasma discharge region, located between the first electrode and the second electrode; and
a plurality of feed points, located at the first electrode and the second electrode so as to introduce high-frequency signals into the reaction chamber to further generate simultaneously a first standing wave and a second standing wave with different temporal and spatial patterns in the plasma discharge region,
wherein at least two of the plurality of feed points are located at one lateral side of one of the first electrode and the second electrode; and
wherein, by adding the first standing wave and the second standing wave in a superposition manner, discharge uniformity of the high frequency plasma is improved.

9. The high frequency plasma apparatus of claim 8, wherein the feed points located at the first electrode are to generate the first standing wave, and the feed points located at the second electrode are to generate the second standing wave.

10. The high frequency plasma apparatus of claim 8, wherein the plurality of feed points used to generate the first standing wave are located on a top, at least one lateral side or a bottom of the first electrode, or a first part of the plurality of feed points are located on at least one lateral side of the first electrode while a second part of the plurality of feed points are located on the top or the bottom of the first electrode; wherein the plurality of feed points used to generate the second standing wave are located on a top, at least one lateral side or a bottom of the second electrode, or a first part of the plurality of feed points are located on at least one lateral side of the second electrode while a second part of the plurality of feed points are located on the top or the bottom of the second electrode.

11. The high frequency plasma apparatus of claim 8, wherein the high-frequency signals to generate the first standing wave and the second standing wave are from either the same power supply or different power supplies; wherein, when the high-frequency signals are from different power supplies, the power supplies are operated either synchronously or asynchronously; wherein frequencies of the high-frequency signals are within HF, VHF or UHF band.

12. The high frequency plasma apparatus of claim 8, wherein the first standing wave and the second standing wave generated simultaneously can be operated in a continuous-wave mode or a pulsed mode; wherein, in the pulsed mode, the first standing wave and the second standing wave appear and disappear simultaneously.

13. The high frequency plasma apparatus of claim 8, wherein, when the first standing wave and the second standing wave have the same amplitude and are 90° out of phase both in time and space, a traveling wave is generated; wherein the temporal and spatial phase differences can be one of the combinations of 90°/90°, −90°/−90°, 90°/−90° and −90°/90°.

14. The high frequency plasma apparatus of claim 8, wherein, when the first standing wave and the second standing wave have similar amplitudes and are 70°~110° out of phase both in time and space, a quasi-traveling wave is generated; wherein the temporal and spatial phase differences can be one of the combinations of 70°~110°/ 70°~110°, −70°~−110°/−70°~−110°, 70°~110°/−70°~−110° and −70°~−110°/70°~110°.

* * * * *